(12) United States Patent
Shoji et al.

(10) Patent No.: US 10,985,006 B2
(45) Date of Patent: Apr. 20, 2021

(54) ELECTROLYTIC PLATING APPARATUS

(71) Applicant: TOSHIBA MEMORY CORPORATION, Tokyo (JP)

(72) Inventors: Fumito Shoji, Yokkaichi Mie (JP); Tatsuo Migita, Nagoya Aichi (JP); Masahiko Murano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 60 days.

(21) Appl. No.: 16/113,960

(22) Filed: Aug. 27, 2018

(65) Prior Publication Data

US 2019/0295836 A1  Sep. 26, 2019

(30) Foreign Application Priority Data

Mar. 20, 2018  (JP) .............................. JP2018-053267

(51) Int. Cl.

| | | |
|---|---|---|
| *H01L 21/02* | (2006.01) | |
| *C23C 18/16* | (2006.01) | |
| *C25D 5/02* | (2006.01) | |
| *H01L 21/67* | (2006.01) | |
| *C25D 17/00* | (2006.01) | |

(Continued)

(52) U.S. Cl.
CPC .... *H01L 21/02021* (2013.01); *C23C 18/1628* (2013.01); *C23C 18/1664* (2013.01); *C25D 5/02* (2013.01); *C25D 7/12* (2013.01); *C25D 17/004* (2013.01); *C25D 17/005* (2013.01);
(Continued)

(58) Field of Classification Search
CPC .......... C25D 5/02; C25D 7/12; C25D 17/004; C25D 17/005; C25D 17/001; C25D 21/00; C25D 21/12; C25D 17/00; C25D 5/006; C25D 7/123; C25D 11/024; C25D 11/005; C25D 5/54; C25D 5/50; C25D 3/58; C25D 17/007; C25D 17/06; C23C 18/1628; C23C 18/1664; H01L 21/02021; H01L 21/288; H01L 21/6723; H01L 21/67253; H01L 21/67051; H01L 21/28079; H01L 21/2885;
(Continued)

(56) References Cited

U.S. PATENT DOCUMENTS

| | | | |
|---|---|---|---|
| 6,495,007 | B2 | 12/2002 | Wang |
| 9,761,524 | B2 | 9/2017 | Kolics |

(Continued)

FOREIGN PATENT DOCUMENTS

| | | |
|---|---|---|
| CN | 104272438 A | 1/2015 |
| CN | 106337199 A | 1/2017 |

(Continued)

*Primary Examiner* — Xiuyu Tai
(74) *Attorney, Agent, or Firm* — Foley & Lardner LLP

(57) ABSTRACT

An electrolytic plating apparatus includes a plating tank that is filled with plating liquid; a moving mechanism configured to vertically move a processing target substrate in a direction normal to a surface of the plating liquid; a seal member that is disposed at a peripheral edge portion of a processing target surface of a processing target substrate and is configured to seal the plating liquid to a center side of the processing target surface when the processing target substrate is immersed in the plating tank; and a contact member that is separated from the seal member and is electrically connected to the processing target surface.

20 Claims, 3 Drawing Sheets

(51) Int. Cl.
*H01L 21/288* (2006.01)
*C25D 7/12* (2006.01)

(52) U.S. Cl.
CPC ........ *H01L 21/288* (2013.01); *H01L 21/6723* (2013.01); *H01L 21/67253* (2013.01)

(58) Field of Classification Search
CPC ... H01L 21/76879; B08B 3/041; B08B 3/022; C25F 3/14
See application file for complete search history.

(56) References Cited

U.S. PATENT DOCUMENTS

| | | |
|---|---|---|
| 10,053,793 B2 | 8/2018 | Berke et al. |
| 10,092,933 B2 | 10/2018 | Kumar et al. |
| 2003/0188974 A1* | 10/2003 | Padhi ................. H01L 21/2885 205/241 |
| 2004/0149573 A1* | 8/2004 | Herchen .............. C25D 17/001 204/297.01 |
| 2007/0256937 A1* | 11/2007 | Basker ..................... C25F 3/14 205/157 |
| 2011/0278162 A1 | 11/2011 | Fredenberg et al. |
| 2013/0192983 A1 | 8/2013 | Fujikata |
| 2013/0292254 A1* | 11/2013 | Kumar .................... C25D 7/12 205/81 |
| 2017/0073832 A1 | 3/2017 | Berke et al. |

FOREIGN PATENT DOCUMENTS

| | | |
|---|---|---|
| CN | 107043953 A | 8/2017 |
| JP | 2002-249896 A | 9/2002 |
| JP | 2002-309398 A | 10/2002 |
| TW | I468552 B | 1/2015 |
| TW | I522496 B | 2/2016 |

\* cited by examiner

ELECTROLYTIC PLATING APPARATUS

CROSS-REFERENCE TO RELATED APPLICATIONS

This application is based on and claims the benefit of Japanese Patent Application No. 2018-053267, filed Mar. 20, 2018, the entire contents of which are incorporated herein by reference.

FIELD

Embodiments described herein relate generally to an electrolytic plating apparatus.

BACKGROUND

An electrolytic plating apparatus for a semiconductor device may be compatible with a substrate that includes various materials. For example, silicon, glass, a compound semiconductor, or the like can be considered as a material of the substrate. In addition, plating may be performed on a substrate formed by bonding a plurality of substrates (e.g. formed of different materials).

Since the semiconductor substrate is immersed in a plating tank, the electrolytic plating apparatus may include a seal member such that plating liquid does not intrude into an undesired portion of the substrate. In some comparative configurations, the seal member is provided on a patterned resist layer, and a contact member for a ground potential is made to contact a low-resistance metal seed layer.

However, an optimum value of a pressing force of the seal member greatly varies depending on a material, a film thickness, or a pattern opening ratio which depends on a contact area of a resist. If the pressing force of the seal member is too strong, there is a possibility that a wafer is stuck to the seal member and the wafer is broken. In addition, if the pressing force of a contact member is too strong, there is a possibility that the semiconductor substrate is chipped or cracked.

The seal member and the contact member in the electrolytic plating apparatus can be provided as an integrally molded structure, and thus it is difficult to separately control pressures of the seal member and the contact member.

In addition, an edge of a wafer which is the semiconductor substrate to be plated may be cut, and if the contact member comes into contact with the edge of the wafer, a contact area may not be sufficiently secured. In this way, if the seal member and the contact member are integrally molded, the seal member and the contact member may not be placed in separate places, and thus, there may be restrictions on places where the seal member and the contact member are disposed.

DETAILED DESCRIPTION

Figure 1:
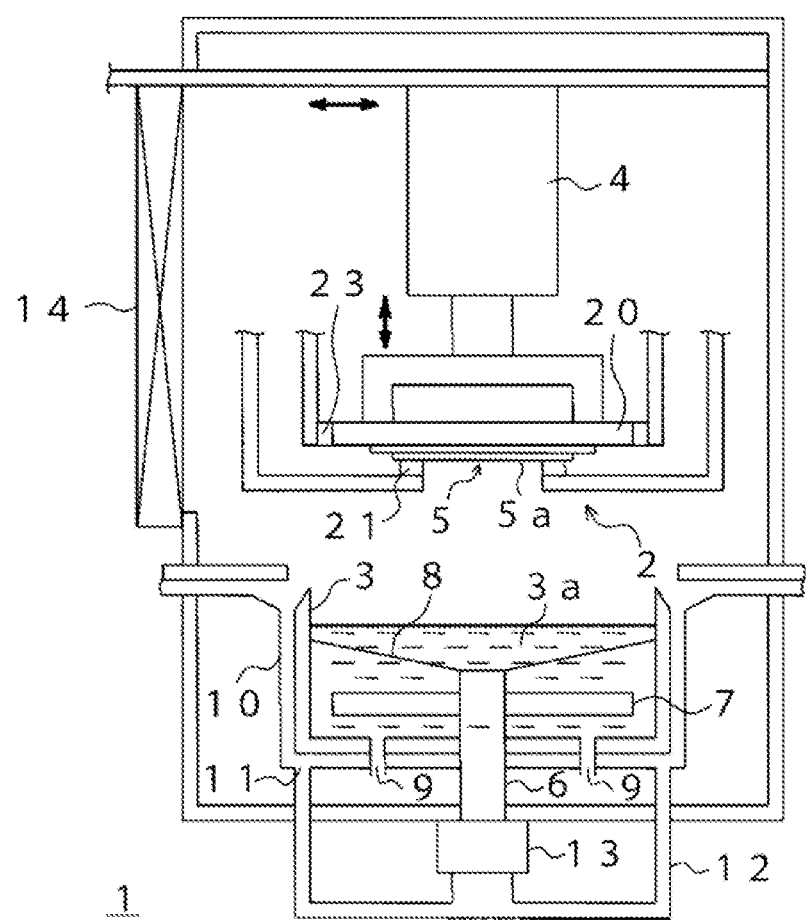
FIG. 1 illustrates a sectional view illustrating a main part of an electrolytic plating apparatus, according to one or more embodiments.

Embodiments described herein provide for an electrolytic plating apparatus that can provide a seal member and a contact member in a desired, calibrated, or selected place and separately adjust pressing forces of the seal member and a contact member.

According to one or more embodiments, an electrolytic plating apparatus includes a plating tank that is filled with plating liquid; a moving mechanism configured to vertically move a processing target substrate in a direction of normal to a surface of the plating liquid; a seal member that is disposed at a peripheral edge portion of a processing target surface of a processing target substrate and is configured to seal the plating liquid to a center side of the processing target surface when the processing target substrate is immersed in the plating tank; and a contact member that is separated from the seal member and is electrically connected to the processing target surface.

Hereinafter, embodiments of the present disclosure will be described with reference to the drawings. In the drawings, a scale, a dimensional ratio in vertical and horizontal directions, and the like may be exaggerated or may differ from actual scales, dimensional ratios, and the like, as appropriate, for the sake of convenient illustration and ready understanding.

Furthermore, a shape, a geometric condition, and extents thereof which are described in the present specification, and, for example, terms such as "parallel", "orthogonal", "same", and the like, values of a length and an angle, and the like may be interpreted within a range that can expect the same or a similar function.

FIG. 1 is a sectional view illustrating a main part of an electrolytic plating apparatus 1 according to one or more embodiments of the present disclosure. The electrolytic plating apparatus 1 of FIG. 1 includes a processing target substrate supporting portion 2, a plating tank 3, and a moving mechanism 4. The processing target substrate supporting portion 2 supports a processing target substrate 5 to be plated, and is described in detail below.

Under a movement control of the moving mechanism 4, the processing target substrate supporting portion 2 is loaded into and unloaded from the electrolytic plating apparatus 1 via a gate valve 14. The plating tank 3 is a cylindrical container of which an upper end side is open. An ejection pipe 6 for ejecting plating liquid 3a is disposed in a vertical direction in a substantially central portion of the plating tank 3. In FIG. 1, the illustrated "perpendicular" direction is set as a vertical direction, that is, a normal direction (depth direction) of a liquid surface of the plating tank 3, and an illustrated horizontal direction is set as the liquid surface direction of the plating tank 3. A front end portion of the ejection pipe 6 is provided near a middle of the plating tank 3 in the depth direction. A substantially disk-shaped anode electrode 7 is disposed around the ejection pipe 6. Cu (copper) ions generated when the anode electrode 7 is melted or heated is supplied into plating liquid 3a, and thereby, a concentration of the Cu ions in the plating liquid 3a can be maintained at a substantially constant level.

A predetermined voltage is applied to the anode electrode 7, and thereby, an electric field is formed between the anode electrode 7 and the processing target substrate 5 to be set to a ground potential by the contact member 23 which will be described below.

The plating tank 3 is isolated by a partition wall 8. An inner circumferential side of the partition wall 8 is connected to a front end portion of the ejection pipe 6, and an outer circumferential side thereof is connected to an inner wall of the plating tank 3. The plating liquid 3a is supplied to a first side (e.g. an upper side) of the partition wall 8 from the ejection pipe 6. The plating liquid 3a is supplied to a second side (e.g. a lower side) of the partition wall 8 via a circulation pipe 9. The partition wall 8 allows ions (e.g. the Cu ions) to pass through (e.g. allows about 90% or more of the Cu ions to pass through, such as about 95% or more, 97% or more, or 99% or more), and does not allow impurity generated when the anode electrode 7 is melted and bubbles such as oxygen or hydrogen generated during the plating processing to pass through (e.g. allows about 10% or less of the impurities, oxygen, or hydrogen to pass through, such as about 5% or less, about 3% or less, or about 1% or less).

The circulation pipe 9 is provided on a bottom side of the plating tank 3. In some embodiments, a plurality of circulation pipes are implemented. The circulation pipe 9 circulates the plating liquid 3a in a region lower than the partition wall 8 of the plating tank 3 by using a pump which is not illustrated. One or more (e.g. two) outlets 11 are provided at the bottom of an outer tank 10 surrounding the periphery of the plating tank 3. A pipe 12 is connected to the outlet 11. A pump 13 is disposed between the pipe 12 and the ejection pipe 6. The pump 13 supplies the plating liquid 3a in a tank not illustrated to the plating tank 3 through the pipe 12.

The structure of the plating tank 3 illustrated in FIG. 1 is merely an example, and the electrolytic plating apparatus 1 according to the present embodiment may be applied to the plating tank 3 having any structure.

The processing target substrate supporting portion 2 makes the seal member 21 come into contact with the processing target substrate 5 and supports the processing target substrate 5 in a state where a processing surface 5a of the processing target substrate 5 is set to the ground potential by the contact member 23. The moving mechanism 4 is connected to the processing target substrate supporting portion 2. The moving mechanism 4 has a function of moving the processing target substrate 5 along the normal direction of a liquid surface of the plating tank 3 and/or a function of moving the processing target substrate 5 along a direction of the liquid surface of the plating tank 3.

The seal member 21 is disposed on the processing surface 5a of the processing target substrate 5 and seals the plating liquid 3a to a center side or portion of the processing surface 5a when the processing target substrate 5 is immersed in the plating tank 3. The seal member 21 may seal off the plating liquid 3a from a peripheral side or portion of the processing surface 5a. The seal member 21 may be disposed closer to a periphery or peripheral edge portion of the processing surface 5a than to a center of the processing surface 5a. The contact member 23 is provided separately from the seal member 21 and is electrically connected to the processing surface 5a, and is disposed closer to the periphery of the processing target substrate 5 than the seal member 21. The contact member 23 comes into contact with the processing target substrate 5 at a location closer to the peripheral edge portion of the processing target substrate 5 than to the seal member 21, or comes into contact with the supporting substrate 20 supporting the processing target substrate 5.

A height in the normal direction of the processing surface 5a of a portion where the contact member 23 is in contact with the processing target substrate 5 or the supporting substrate 20, and a height in the normal direction of the processing surface 5a of a portion where the seal member 21 is in contact with the processing target substrate 5 are controlled separately from each other. The contact member 23 comes into contact with at least one of a first end surface of the processing target substrate 5 on a side connected to the processing surface 5a (e.g. a lateral surface of the processing target substrate 5), a second end surface of the processing target substrate 5 opposite to the processing surface 5a, a third end surface of the supporting substrate 20 on a side of the supporting substrate 20 that supports the processing target substrate 5 (e.g. a side on which the supporting substrate 20 contacts the processing target substrate 5), and a fourth end surface of the supporting substrate 20 opposite to a contact surface of the processing target substrate 5 on the supporting substrate 20 (e.g. a side of the supporting substrate 20 opposite to the side on which the supporting substrate 20 contacts the processing target substrate 5). A pressing force applied to the processing target substrate 5 by the seal member 21, and a pressing force applied to the processing target substrate 5 or the supporting substrate 20 by the contact member 23 are controlled separately from each other.

The contact member 23 may be separately connected to at least one of the first to fourth end surfaces at each of a plurality of portions. In addition, in each of a plurality of portions, the pressing force applied by the contact member 23 to the processing target substrate 5 may be selectively controlled. The height in the normal direction of the processing surface 5a at the portion where the contact member 23 is in contact with the processing target substrate 5 or the supporting substrate 20, and the height input terminal the normal direction of the processing target surface 5a at the portion where the seal member 21 is in contact with the processing target substrate 5 may be controlled separately from each other in each of a plurality of portions.

Figure 2:
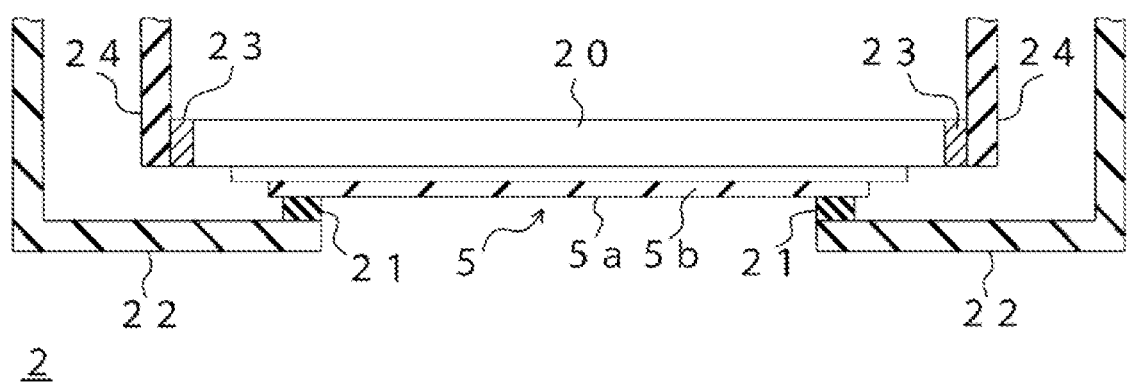
FIG. 2 is a view illustrating a detailed structure of a processing target substrate supporting portion, according to one or more embodiments.

FIG. 2 is a diagram illustrating a detailed structure of the processing target substrate supporting portion 2. FIG. 2 illustrates an example in which the processing target substrate supporting portion 2 includes the supporting substrate 20 that supports the processing target substrate 5. In a case where a through silicon via (TSV) is formed on the processing target substrate 5, the processing target substrate 5 can to be thinned through polishing processing, and thereby, the processing target substrate 5 adheres to the supporting substrate 20. The plating processing described herein may be performed in a state where the processing target substrate 5 adheres to the supporting substrate 20.

FIG. 2 illustrates an example in which the processing target substrate 5 adhered onto the supporting substrate 20 is disposed downwardly (e.g. under the supporting substrate 20, with an exposed surface facing downward or towards the plating tank 3). The plating tank 3 illustrated in FIG. 1 is disposed at a place lower than the processing target surface 5a, which is plated, of processing target substrate 5, and during the plating processing, the processing target substrate 5 is immersed in the plating tank 3.

The seal member 21 may be disposed closer to a periphery or peripheral edge portion of the processing surface 5a than to a center of the processing surface 5a. The seal member 21 is a ring-shaped structure surrounding the center side of the processing target surface 5a, and seals the plating liquid 3a in the center side of the processing target surface 5a when the processing target substrate 5 is immersed in the plating tank 3. The seal member 21 adheres onto, for example, a resist film 5b on the processing target surface 5a. The seal member 21 includes an elastic insulating material such as resin. When the processing target substrate 5 is immersed in the plating tank 3, the moving mechanism 4 moves the processing target substrate 5 to a lower position shown in FIG. 2. The seal member 21 is bonded to a seal supporting member 22, and if the processing target substrate 5 is moved downwardly by the moving mechanism 4, the seal supporting member 22 presses the seal member 21 upwardly, and thereby, stress by which the seal member 21 presses the processing target substrate 5 increases and sealing effects increase. By adjusting a length of the seal supporting member 22 in the vertical direction, the stress by which the seal member 21 presses the processing target substrate 5 can be selected appropriately. Thereby, an excessive pressing force enough for the seal member 21 to be stuck to the processing target substrate 5 is not applied, and the processing target substrate 5 can be selected so as to be pressed by a pressing force to the extent that a desired sealing effect can be obtained.

The contact member 23 is separated from the seal member 21. The contact member 23 is in contact with the outer circumferential side surface of the supporting substrate 20. The contact member 23 includes a conductive material and is in contact with a contact supporting member 24 extending upwardly. A height of the supporting substrate 20 in the vertical direction can be adjusted by adjusting a length of the contact supporting member 24 in the vertical direction. Thereby, the pressing force of the supporting substrate 20 caused by the contact member 23 can be selected. The contact member 23 is set to the ground potential and becomes a reference potential for an anode potential applied to the anode electrode 7 (shown in FIG. 1) during the plating processing.

As described above, since the contact member 23 is separated from the seal member 21, an adhesion position, an adhesion height, and the pressing force of the contact member 23 can be selected independently from an adhesion position, an adhesion height, and the pressing force of the seal member 21. Thus, both the contact member 23 and the seal member 21 may be configured appropriately with regard to the adhesion position, the adhesion height and the pressing force, as compared with a case where the contact member 23 and the seal member 21 are integrally molded.

Figure 3:
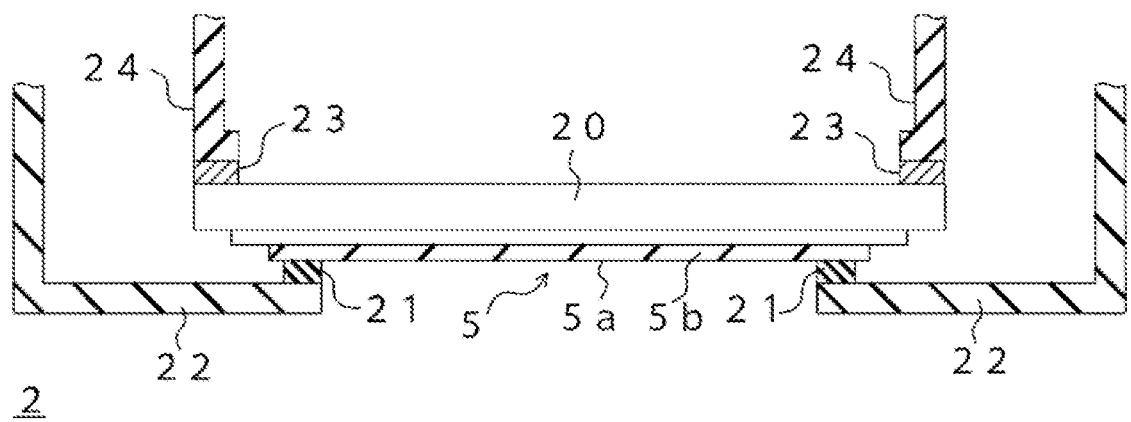
FIG. 3 is a view illustrating an example in which a contact member comes into contact with a surface of a supporting substrate, according to one or more embodiments.

FIG. 2 illustrates an example in which the contact member 23 is in contact with the outer circumferential side surface of the supporting substrate 20, but the contact member 23 may be in contact with a surface (also referred to as a back surface in the present specification) of the supporting substrate 20 opposite to a surface of the of the supporting substrate 20 that contacts the processing target substrate 5 as illustrated in FIG. 3. In some embodiments the contact member 23 may be in contact with a surface of the supporting substrate 20 that also contacts the processing target substrate 5 as illustrated in FIG. 4.

Figure 4:
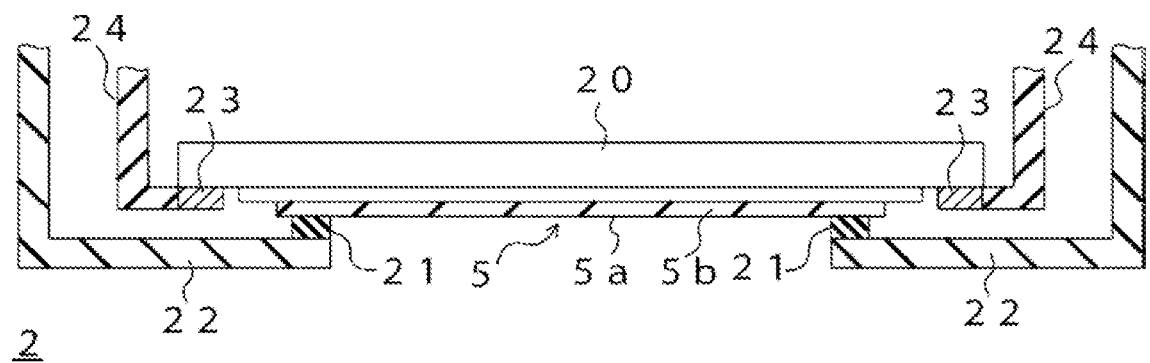
FIG. 4 is a view illustrating an example in which a contact member comes into contact with a surface of the supporting substrate, according to one or more embodiments.

FIGS. 2 to 4 show configurations that are similar in that the contact member 23 is separated from the seal member 21, and as long as the contact member 23 is separated from the seal member 21, a contact state of the contact member 23 is not limited. For example, the contact member 23 may be in contact with at least two surfaces among the processing target surface 5a, a side surface, and a back surface of the supporting substrate 20.

Figure 5:
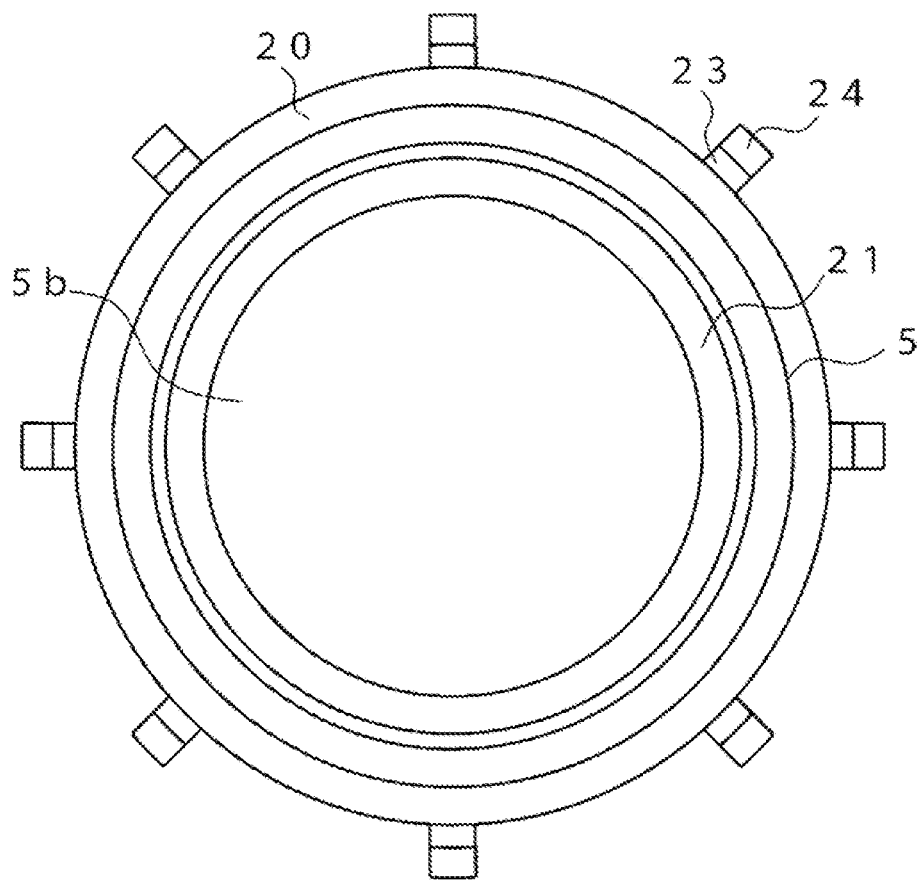
FIG. 5 is a plan view of a processing target substrate supporting portion viewed from a processing target surface side, according to one or more embodiments.

FIG. 5 is a plan view of the processing target substrate supporting portion 2 viewed from a side of the processing target surface 5a. As illustrated in FIG. 5, the seal member 21 has an annular shape, and the contact member 23 is provided at a plurality of portions at predetermined intervals along the outer peripheral edge of the supporting substrate 20. A plurality of contact members 23 are separated from each other and are also spaced apart from the seal member 21. Thus, it is possible to adjust the adhesion position, the adhesion height, and the pressing force of each contact member 23 with respect to the supporting substrate 20. A thickness of the processing target substrate 5 in the in-plane direction and a manner of application of a stress change may depend on a processing precision at the time of manufacturing. Such variations in the processing target substrate 5 can be accounted for by separately adjusting the adhesion positions, the adhesion heights, and the pressing forces of the plurality of contact members 23.

Figure 6:
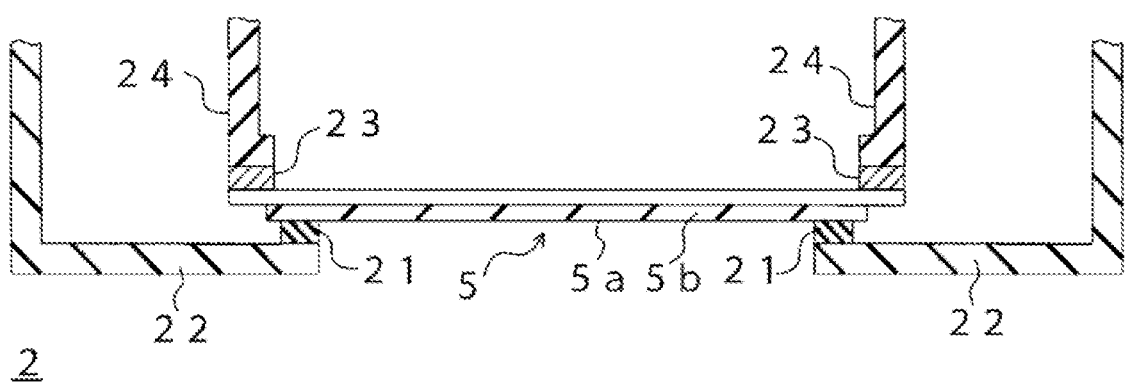
FIG. 6 is a view illustrating an example of a contact state between a seal member and the contact member in a case where the processing target substrate is plated without a supporting substrate, according to one or more embodiments.

FIGS. 2 to 4 illustrate an example in which the plating processing is performed while the processing target substrate 5 adheres onto the supporting substrate 20, but the present embodiment can also be applied in a case where the plating processing is performed for the processing target substrate 5 while omitting the supporting substrate 20. FIG. 6 is a diagram illustrating an example of a contact state of the seal member 21 and the contact member 23 in a case where the processing target substrate 5 is plated without the supporting substrate 20. In the embodiments shown in FIG. 6, the contact state of the seal member 21 is the similar to that shown in FIGS. 2 to 4, but the contact member 23 is in contact with a surface opposite to the processing target surface 5a of the processing target substrate 5, that is, a back surface. As a modification example of FIG. 6, the contact member 23 may be disposed on the outer peripheral side surface of the processing target substrate 5.

As described above, in the present embodiment, the seal member 21 and the contact member 23 are separated from each other, and thereby, the adhesion position, the adhesion height, and the pressing force of the seal member 21 can be selected independently from the adhesion position, the adhesion height, and the pressing force of the contact member 23. Thus, it is possible to appropriately select the adhesion positions, the adhesion heights, and the pressing forces of the seal member 21 and the contact member 23, respectively.

According to the embodiments described herein, the adhesion positions, the adhesion heights, and the pressing force of the seal member 21 and the contact member 23 can improved, such as in a case where the plating processing is performed while the processing target substrate 5 adheres to the supporting substrate 20, and such as in a case where the plating processing is performed without making the processing target substrate 5 adhere to the supporting substrate 20.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An electrolytic plating apparatus comprising:
   a plating tank that is filled with plating liquid;
   a moving mechanism configured to vertically move a processing target substrate in direction normal to a surface of the plating liquid;
   a seal member that is disposed at a peripheral edge portion of a processing target surface of the processing target substrate and is configured to seal the plating liquid to a center side of the processing target surface when the processing target substrate is immersed in the plating tank; and
   a contact member that is separated from the seal member and is electrically connected to the processing target surface; and
   a contact support member that supports the contact member and is configured to adjust a distance from the contact member to the surface of the plating liquid along a direction normal to the surface of the plating liquid,
   wherein the moving mechanism is configured to apply separately a first pressing force via the seal member and a second pressing force via the contact member, the first pressing force being a pressure applied to the processing target surface of the processing target substrate by the seal member, and the second pressing force being a pressure applied to a supporting substrate bonded to the processing target substrate by the contact member.

2. The electrolytic plating apparatus according to claim 1, wherein the seal member has an annular shape.

3. The electrolytic plating apparatus according to claim 2, wherein the contact member is provided at a plurality of portions at predetermined intervals along an outer peripheral edge of a supporting substrate which supports the processing target substrate.

4. The electrolytic plating apparatus according to claim 3, comprising a plurality of contact members including the contact member, wherein the plurality of contact members are separated from each other.

5. The electrolytic plating apparatus according to claim 4, wherein the seal member and the plurality of contact members are separated from each other.

6. The electrolytic plating apparatus according to claim 2, wherein the seal member comprises an elastic insulating material.

7. The electrolytic plating apparatus according to claim 1, wherein the contact member is in physical contact with at least one of a first surface which is a surface of the supporting substrate on a side of the supporting substrate that supports the processing target substrate, a second surface which is a side surface of the supporting substrate, or a third surface which is a surface of an opposite side of the first surface.

8. The electrolytic plating apparatus according to claim 7, wherein the contact member is in physical contact with the first surface.

9. The electrolytic plating apparatus according to claim 7, wherein the contact member is in physical contact with the second surface.

10. The electrolytic plating apparatus according to claim 7, wherein the contact member is in physical contact with the third surface.

11. An electrolytic plating apparatus comprising:
    a plating tank configured to hold plating liquid;
    a processing target substrate support configured to support a processing target substrate, the processing target substrate support being movable in a direction normal to a surface of the plating liquid;
    a seal disposed at a peripheral edge portion of a processing target surface of the processing target substrate and is configured to seal the plating liquid to a center side of the processing target surface when the processing target substrate is immersed in the plating tank;
    a conductive contact, separate from the seal, electrically connected to the processing target surface; and
    a conductive contact support member that supports the conductive contact and is configured to adjust a distance from the conductive contact to the surface of the plating liquid along a direction normal to the surface of the plating liquid; and
    a moving mechanism configured to apply separately a first pressing force via the seal and a second pressing force via the conductive contact, the first pressing force being a pressure applied to the processing target surface of the processing target substrate by the seal, and the second pressing force being a pressure applied to a supporting substrate bonded to the processing target substrate by the conductive contact.

12. The electrolytic plating apparatus according to claim 11, wherein the seal has an annular shape.

13. The electrolytic plating apparatus according to claim 12, wherein the conductive contact is provided at a plurality of portions at predetermined intervals along an outer peripheral edge of a supporting substrate which supports the processing target substrate.

14. The electrolytic plating apparatus according to claim 13, comprising a plurality of conductive contacts including the conductive contact, wherein the plurality of conductive contacts are separated from each other.

15. The electrolytic plating apparatus according to claim 14, wherein the seal and the plurality of conductive contacts are separated from each other.

16. The electrolytic plating apparatus according to claim 12, wherein the seal comprises an elastic insulating material.

17. The electrolytic plating apparatus according to claim 11, wherein the conductive contact is in physical contact with at least one of a first surface which is a surface of the supporting substrate on a side of the supporting substrate that supports the processing target substrate, a second surface which is a side surface of the supporting substrate, or a third surface which is a surface of an opposite side of the first surface.

18. The electrolytic plating apparatus according to claim 17, wherein the conductive contact is in physical contact with the first surface.

19. The electrolytic plating apparatus according to claim 17, wherein the conductive contact is in physical contact with the second surface.

20. The electrolytic plating apparatus according to claim 17, wherein the conductive contact is in physical contact with the third surface.

\* \* \* \* \*